United States Patent [19]

Wada

[11] Patent Number: 5,369,361
[45] Date of Patent: Nov. 29, 1994

[54] POSITION DETECTING DEVICE EMPLOYING A MAGNET AND BACK YOKE RELATIVELY MOVABLE WITH RESPECT TO A HALL SENSOR

[75] Inventor: Jyoji Wada, Yokohama, Japan

[73] Assignee: Matsushita Electric Industrial Co., Ltd., Osaka, Japan

[21] Appl. No.: 913,618

[22] Filed: Jul. 16, 1992

[30] Foreign Application Priority Data

Jul. 24, 1991 [JP] Japan ................. 3-184390

[51] Int. Cl.$^5$ ................. G01B 7/14; H01H 36/00
[52] U.S. Cl. ................. 324/207.2; 307/116; 324/207.24
[58] Field of Search ................. 324/173, 174, 207.2, 324/207.21, 207.24, 207.26, 235, 251, 252; 73/DIG. 3; 307/116

[56] References Cited

U.S. PATENT DOCUMENTS

| | | |
|---|---|---|
| 3,473,109 | 10/1969 | Maaz et al. |
| 3,750,068 | 7/1973 | Hallin |
| 4,061,988 | 12/1977 | Lewandowski |
| 4,124,814 | 11/1978 | Lauerman ................. 324/207.2 |
| 4,737,710 | 4/1988 | Van Antwerp et al. ................. 324/207.2 |

FOREIGN PATENT DOCUMENTS

| | | |
|---|---|---|
| 2056006 | 11/1982 | France |
| 1303222 | 6/1971 | Germany |
| 2236182 | 9/1990 | Japan |
| 2284082 | 11/1990 | Japan |
| 2100443 | 12/1982 | United Kingdom |

*Primary Examiner*—Gerard R. Strecker
*Attorney, Agent, or Firm*—Stevens, Davis, Miller & Mosher

[57] ABSTRACT

Disclosed is a position detecting device of magnetic detection type capable of accurate position detection. The device comprises a magnet consisting of an N-pole part and an S-pole part, a back yoke formed with upstanding projections extending up to the surface level of the N-pole part of the magnet, the S-pole part of the magnet being bonded to the central area of the back yoke, and a Hall IC located to make parallel movement relative to both the exposed upper surface of the N-pole part of the magnet and the upper end surfaces of the projections of the back yoke in slightly spaced apart relation. When the Hall IC moves above narrow spaces, which are defined between the magnet and the projections of the back yoke and in each of which the magnetic flux density is zero (the neutral zone between the N pole and the S pole), the threshold of the Hall IC is crossed by the magnetic flux density curve in each of these narrow spaces, so that the position can be detected without any substantial error.

10 Claims, 2 Drawing Sheets

POSITION DETECTING DEVICE EMPLOYING A MAGNET AND BACK YOKE RELATIVELY MOVABLE WITH RESPECT TO A HALL SENSOR

BACKGROUND OF THE INVENTION

This invention relates to a position detecting device of magnetic detection type for use in, for example, a switch of contactless type.

FIG. 1 is a perspective view schematically showing the structure of a prior art position detecting device of magnetic detection type. Referring to FIG. 1, a magnet 1 is magnetized to be divided into an N-pole part 1a and an S-pole part 1b, and the magnet 1 is joined or bonded at the exposed lower surface of its S-pole part 1b to a back yoke 2. This back yoke 2 is made of a magnetic material, such as, iron or zinc. A Hall IC 4, which is movable relative to the magnet assembly consisting of the magnet 1 and the back yoke 2, is located above the magnet assembly so as to make parallel movement along the exposed upper surface of the N-pole part 1a of the magnet 1 in a relation slightly spaced from the magnet assembly.

The operation of the prior art position detecting device having the above structure will now be described by reference to FIGS. 2A and 2B. Referring to FIGS. 2A and 2B, the magnetic flux density sensed by the Hall IC 4 changes while the Hall IC 4 is moving along the path of its parallel movement slightly spaced from the upper surface of the magnet 1. At the position where the magnetic flux density decreases to zero, the output signal of the Hall IC 4 turns into its low (L) level, so that the moving position of the Hall IC 4 can be detected. Thus, in the case of the prior art position detecting device of magnetic detection type too, the position of the Hall IC 4 moving relative to the magnet assembly can be detected.

However, in the prior art position detecting device of magnetic detection type described above, the magnetic flux density sensed by the Hall IC 4 with the movement of the Hall IC 4 changes quite gradually. Therefore, the portions of the magnetic flux density curve in the vicinity of both the rising edge M and the falling edge N of the output signal of the Hall IC 4 have a slope-like waveform as shown in FIG. 2A, and the moving position of the Hall IC 4 cannot be accurately detected. As a result, the detected position tends to fluctuate. Further, as is commonly known, the threshold of the Hall IC 4 tends to fluctuate in a range where zero is its lower limit. Thus, the prior art position detecting device has been defectives. in that an error tends to inevitably occur in the detected position, with the result that the position cannot be accurately detected.

SUMMARY OF THE INVENTION

With a view to solve the prior art problem described above, it is an object of the present invention to provide an improved position detecting device of magnetic detection type which can accurately detect the position.

The present invention which attains the above object provides a position detecting device of magnetic detection type comprising a magnet magnetized to be divided into an S-pole part and an N-pole part, a back yoke bonded at one of its surfaces to one of the surfaces of the magnet and bent at its both end portions to form projections extending up to the level of the other surface of the magnet and having a magnetic polarity opposite to that of the other surface of the magnet, and magnetic sensor means located so as to be movable relative to both the other surface of the magnet and the end surfaces of the projections of the back yoke in slightly spaced apart relation thereby generating an output signal indicative of the result of magnetic position detection.

Therefore, the position detecting device of magnetic detection type according to the present invention is advantageous over the prior art device in that the device can detect the boundary between the part of the magnet having one of the magnetic polarities and the part of the back yoke having the opposite magnetic polarity, so that the threshold of the magnetic sensor means is necessarily crossed by the magnetic flux density curve in a narrow space at the boundary, thereby ensuring the desired position detection without any substantial error.

DESCRIPTION OF THE PREFERRED EMBODIMENTS

A preferred embodiment of the position detecting device of magnetic detection type according to the present invention will now be described by reference to the drawings.

Figure 1:
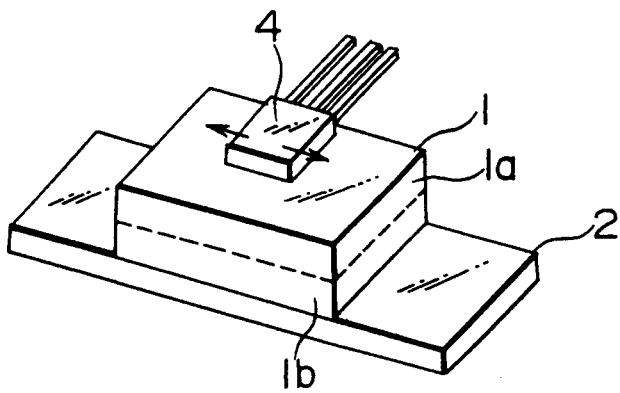
FIG. 1 is a perspective view schematically showing the structure of a prior art position detecting device of magnetic detection type.
Figure 2A:
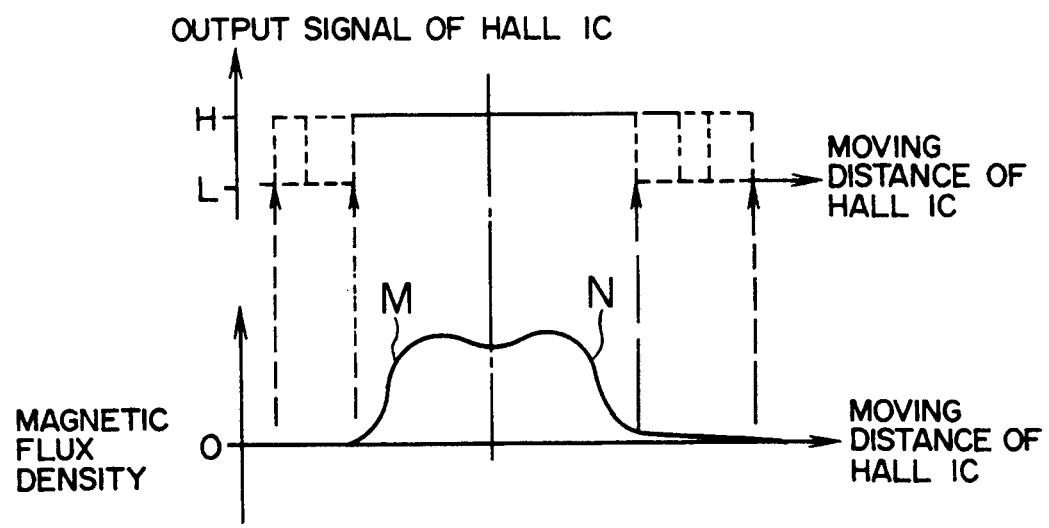
FIG. 2A illustrates the magnetic flux density sensed by the Hall IC shown in FIG. 1 and the resultant output signal of the Hall IC.
Figure 2B:
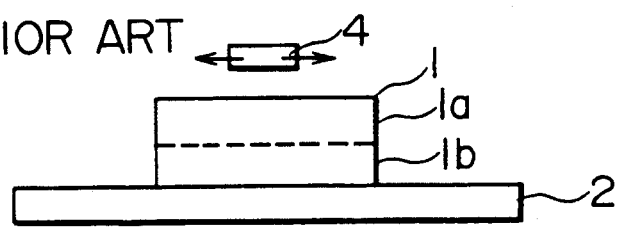
FIG. 2B is a front elevational view showing the reciprocating movement of the Hall IC shown in FIG. 1.
Figure 3:
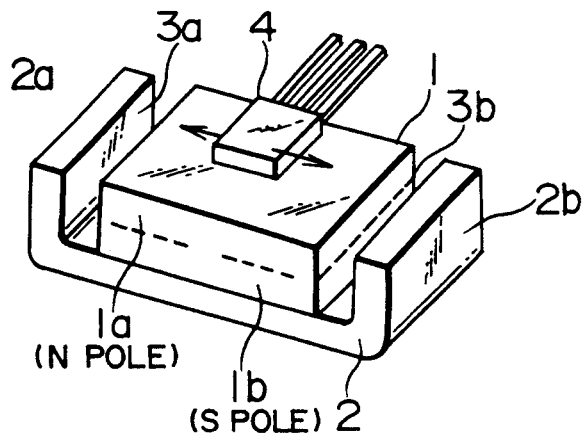
FIG. 3 is a perspective view schematically showing the structure of an embodiment of the position detecting device of magnetic detection type according to the present invention.

FIG. 3 shows schematically the structure of the illustrated embodiment. In FIG. 3, like reference numerals are used to designate like parts appearing in FIG. 1. Referring now to FIG. 3, a magnet 1 consists of an N-pole part 1a and an S-pole part 1b formed by magnetization into the N and S polarities respectively, and a back yoke 2 is joined or bonded to the exposed lower surface of the S-pole part 1b of the magnet 1. This back yoke 2 is made of a magnetic material, and its both end portions are bent to form upstanding projections 2a and 2b. These projections 2a and 2b extend up to the level of the exposed upper surface of the N-pole part 1a of the magnet 1. Therefore, these projections 2a and 2b have the magnetic polarity which is the same as that of the S pole.

Narrow spaces 3a and 3b are defined between the magnet 1 and these projections 2a and 2b of the back yoke 2 respectively, and, in each of these spaces 3a and 3b, the magnetic flux density is zero (the neutral zone between the S pole and the N pole). A Hall IC 4 is located above the magnet assembly consisting of the magnet 1 and the back yoke 2 to make parallel movement along the exposed upper surface of the N-pole part 1a of the magnet assembly in slightly spaced apart relation.

The operation of the position detecting device of the present invention will now be described.

Figure 4A:
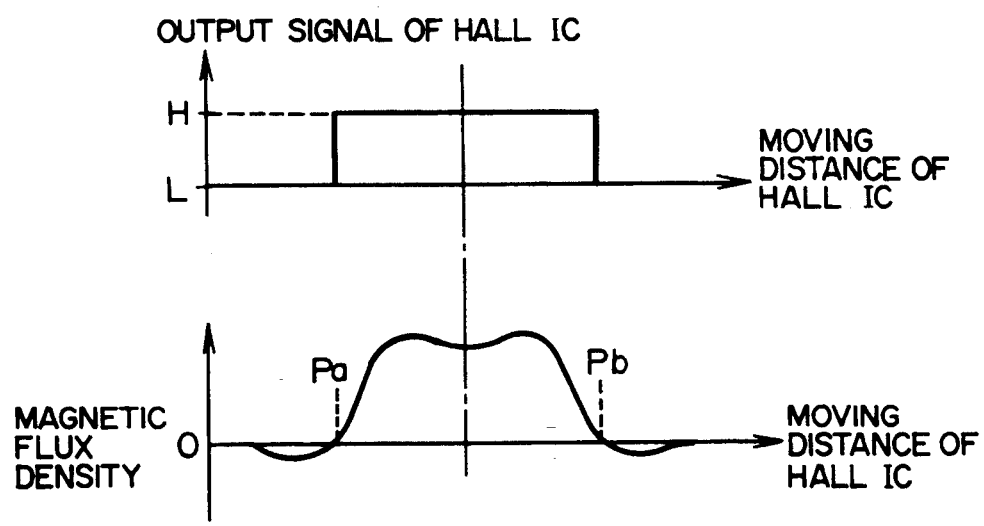
FIG. 4A illustrates the magnetic flux density sensed by the Hall IC shown in FIG. 3 and the resultant output signal of the Hall IC.
Figure 4B:
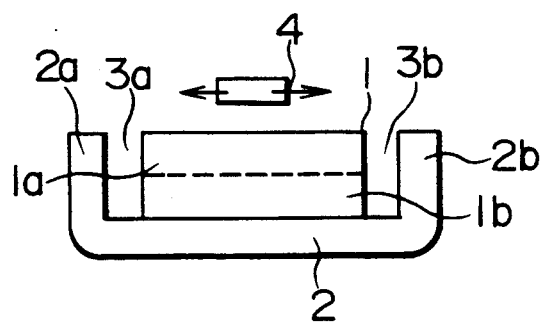
FIG. 4B is a front elevational view showing the reciprocating movement of the Hall IC shown in FIG. 3.

FIG. 4A illustrates the magnetic flux density sensed by the Hall IC 4 and the resultant output signal of the Hall IC 4, and FIG. 4B shows the reciprocating movement of the Hall IC 4.

Referring to FIGS. 4A and 4B, the magnetic flux density sensed by the Hall IC 4 changes along the path of reciprocating movement of the Hall IC 4 while the Hall IC 4 is making its parallel movement along the surface of the N-pole part 1a of the magnet 1. When the Hall IC 4 reciprocates above the space 3a between the magnet 1 and the projection 2a of the back yoke 2, the magnetic polarity is inverted from that of the S pole to that of the N pole or from that of the N pole to that of the S pole, as shown at a point Pa in FIG. 4A. Similarly, when the Hall IC 4 reciprocates above the space 3b between the magnet 1 and the projection 2b of the back yoke 2 during its movement, the magnetic polarity is inverted from that of the S pole to that of the N pole or from that of the N pole to that of the S pole, as shown at a point Pb in FIG. 4A.

Because, in this case, the threshold of the Hall IC 4 is necessarily crossed by the magnetic flux density curve while the Hall IC 4 is reciprocating above the narrow spaces 3a and 3b, the output signal of the Hall IC 4 definitely changes or starts to rise from its low (L) level to its high (H) level or starts to fall from its high (H) level to its low (L) level, as shown in FIG. 4A.

As described above, the both end portions of the back yoke 2 are bent to form the upstanding projections 2a and 2b so as to establish the narrow spaces 3a and 3b where the magnetic flux density sensed by the Hall IC 4 moving along its path of reciprocating movement is inverted in the magnetic polarity. Thus, the threshold of the Hall IC 4 is necessarily crossed by the magnetic flux density curve due to the magnetic polarity inversion in the narrow spaces 3a and 3b, so that the position can be reliably accurately detected.

As also described above, the Hall IC 4 has such a general tendency that its threshold may fluctuate in a range where the lower limit is zero. However, because of the presence of the generator of the magnetic polarity inversion, the magnetic flux density sensed by the Hall IC 4 greatly changes during a slight movement of the Hall IC 4, so that the position can be detected without any substantial error.

It will be apparent from the foregoing description that the position detecting device of magnetic detection type according to the present invention detects the boundary between the part of the magnet having one of the magnetic polarities and the part of the back yoke having the opposite magnetic polarity, so that the threshold of the magnetic sensor means is necessarily crossed by the magnetic flux density curve in a narrow space at the boundary, thereby ensuring the desired position detection without any substantial error.

I claim:

1. A position detecting device comprising:
    a magnet having a first surface magnetized with a first pole and a second surface magnetized with a second pole having a polarity opposite to a polarity of said first pole;
    a back yoke of a magnetic material having a base portion and end portions, said back yoke being bonded at said base portion to said first surface of said magnet and bent at said end portions to form projections extending substantially aligned with a level of said second surface of said magnet and having a magnetic polarity opposite to that of said second surface of said magnet; and
    magnetic sensor means, movable relative to both said second surface of said magnet and said end surfaces of the projections of said back yoke and positioned in slightly spaced apart relation therefrom, for detecting a relative position between said magnetic sensor means and said magnet and said back yoke by sensing a density of a magnetic flux generated soley by magnet and said back yoke and for deriving from said detected magnetic flux density an output signal indicative of said relative position,
    wherein said end portions are spaced from said magnet to form spaces between said end portions and said magnet, and wherein said magnetic flux density detected by said magnetic sensor means is inverted in polarity at stationary points in said spaces.

2. A position detecting device of magnetic detection type according to claim 1, wherein said magnetic sensor means is a Hall IC.

3. A position detecting device as in claim 2, wherein the Hall IC derives the output signal by comparing the detected magnetic flux density with a threshold level.

4. A position detecting device as in claim 1, wherein said back yoke is bonded only to said first surface and not to said second surface of said magnet.

5. A position detecting device of magnetic detection type comprising:
    a magnet having an upper surface magnetized with a first pole and a lower surface magnetized with a second pole having a polarity opposite to a polarity of said first pole;
    a back yoke of a magnetic material having a center base portion bonded to said lower surface of said magnet and having laterally extending end portions bent upwardly to form a pair of projections so that free end portions of said pair of projections are substantially aligned with said upper surface of said magnet to form narrow spaces between said magnet and said pair of projections, said free end surfaces of said pair of projections having a magnetic polarity opposite to that of said upper surface of said magnet; and
    a Hall sensor movable horizontally in proximity to and along said upper surface of said magnet and said free end surfaces of said pair of projections of said back yoke, said Hall sensor detecting its position relative to said magnet by detecting a stationary inversion point of a magnetic polarity of magnetic flux density in a selected one of said spaces between said magnet and said pair of projections.

6. A position detecting device as in claim 5, wherein said back yoke is bonded only to said lower surface and not to said upper surface of said magnet.

7. A position detecting device comprising:
    a magnet having a first surface magnetized with a first pole and a second surface magnetized with a second pole having a polarity opposite to a polarity of said first pole;
    a back yoke of a magnetic material having a base portion and an end portion, said back yoke being bonded at said base portion to said first surface of said magnet and bent at said end portion to form a projection extending substantially aligned with a level of said second surface of said magnet and having a magnetic polarity opposite to that of said second surface of said magnet; and magnetic sensor means, movable relative to both said second surface of said magnet and said end surface of the projection of said back yoke and positioned in slightly spaced apart relation therefrom, for detecting a relative position between said magnetic sensor means and said magnet and said back yoke by sensing a density of a magnetic flux generated solely by said magnet and said back yoke and for deriving from said detected magnetic flux density an output signal indicative of said relative position, wherein said end portion is spaced from said magnet to form a space between said end portion and said magnet, and wherein said magnetic flux density detected by said magnetic sensor means is inverted in polarity at a stationary point in said space.

8. A position detecting device as in claim 7, wherein said magnetic sensor means is a Hall IC.

9. A position detecting device as in claim 8, wherein the Hall IC derives the output signal by comparing the detected magnetic flux density with a threshold level.

10. A position detecting device as in claim 7, wherein said back yoke is bonded only to said first surface and not to said second surface of said magnet.

* * * * *